United States Patent
You et al.

(10) Patent No.: US 6,297,102 B1
(45) Date of Patent: Oct. 2, 2001

(54) METHOD OF FORMING A SURFACE IMPLANT REGION ON A ROM CELL USING A PLDD IMPLANT

(75) Inventors: Jyh-Cheng You, I-Lan County; Lin-June Wu, Hsin-Chu, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/409,874

(22) Filed: Oct. 1, 1999

(51) Int. Cl.$^7$ ................................................ H01L 21/8234
(52) U.S. Cl. .................... 438/275; 438/227; 438/262; 438/278
(58) Field of Search .................. 438/275, 227, 438/282, 283, 262, 278

(56) References Cited

U.S. PATENT DOCUMENTS

| | | | |
|---|---|---|---|
| 4,745,083 | * 5/1988 | Huie | 437/45 |
| 5,098,855 | * 3/1992 | Komori et al. | 437/52 |
| 5,308,781 | 5/1994 | Ando et al. | 437/48 |
| 5,506,159 | 4/1996 | Enomoto | 437/43 |
| 5,538,914 | 7/1996 | Chin et al. | 437/48 |
| 5,580,809 | * 12/1996 | Mori et al. | 437/48 |
| 5,650,341 | 7/1997 | Yang et al. | 437/34 |
| 5,683,925 | 11/1997 | Irani et al. | 437/45 |
| 5,700,729 | 12/1997 | Lee et al. | 438/230 |
| 5,830,795 | 11/1998 | Mehta et al. | 438/275 |
| 5,843,816 | 12/1998 | Liaw et al. | 438/238 |
| 5,866,456 | 2/1999 | Abe | 438/275 |
| 5,893,737 | * 4/1999 | Takashi et al. | 438/275 |
| 5,898,006 | * 4/1999 | Kudoh | 438/275 |
| 6,107,126 | 8/2000 | Wu | 438/217 |

* cited by examiner

Primary Examiner—Wael Fahmy, Jr.
Assistant Examiner—Kurt Eaton
(74) Attorney, Agent, or Firm—George O. Saile; Stephen B. Ackerman; William J. Stoffel

(57) ABSTRACT

The invention provides a method for forming a ROM cell surface implant region using a PLDD implant. A semiconductor structure is provided comprising a substrate having isolation structures thereon, which separate and electrically isolating a first area having a P-well formed in the substrate and a gate over the substrate, a second area having a N-well formed in the substrate and a gate over the substrate, and a third area having P-well and buried N+ regions formed in the substrate with second isolation structures overlying the buried N+ regions. A photoresist mask is formed exposing the first area, and impurity ions are implanted to form n-type lightly doped source and drain regions. The photoresist mask is removed and a new (PLDD/ROM) photoresist mask is formed exposing the second area and the third area. Impurity ions are implanted to simultaneously form p-type lightly doped source and drain regions and a ROM cell surface implant region region. The PLDD/ROM photoresist mask is then removed.

8 Claims, 3 Drawing Sheets

METHOD OF FORMING A SURFACE IMPLANT REGION ON A ROM CELL USING A PLDD IMPLANT

BACKGROUND OF THE INVENTION

1) Field of the Invention

This invention relates generally to fabrication of a semiconductor device and more particularly to a method of combining PLDD (p-type lightly doped drain) implant and surface implant for ROM cell surface implant region to reduce processing steps and simplify the process.

2) Description of the Prior Art

Currently, CMOS ROM cells require numerous photolithograpy and implant steps for NLDD (n-type lightly doped source and drain regions), PLDD (p-type lightly doped source and drain regions), n-type and p-type source and drain region implants, and surface implants for ROM cell surface implant region. These photolithography and implant steps add cost and processing time as well as increasing opportunities for loss Is of cells due to processing variations. A need exists to reduce the number of processing steps, thereby reducing cost and processing time and improving process yield.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,538,914 (Chiu et al.) teaches a LDD method for a ROM.

U.S. Pat. No. 5,700,729 (Lee et al.) discloses a masked gate MOS source and drain ion implant method including a PLDD.

U.S. Pat. No. 5,830,795 (Mehta et al.) recites a simplified masking process for a logic device including PLDD and Vt ion implant steps.

U.S. Pat. No. 5,843,816 (Liaw et al.) shows a process for a SRAM using a PLDD implant step.

U.S. Pat. No. 5,650,341 (Yang et al.) teaches a method for forming a CMOS PLDD and NLDD using a method to reduce masking steps and costs.

SUMMARY OF THE INVENTION

It is an object of the present invention to provide a method for combining a PLDD (p-type lightly doped drain) implant and a surface implant for ROM cell surface implant region.

It is an object of the present invention to provide a method for combining a PLDD (p-type lightly doped drain) implant and a surface implant for ROM cell surface implant region in a flat cell mask ROM process.

It is another object of the present invention to provide a method for forming a ROM cell surface implant region using a PLDD implant.

It is another object of the present invention to provide a method for forming a CMOS ROM cell which reduces the number of processing steps.

It is yet another object of the present invention to provide a method for forming a CMOS ROM cell which reduces cycle time and cost.

To accomplish the above objectives, the present invention provides a method for forming a ROM cell surface implant region using a PLDD implant, thereby reducing the number of processing steps required. The method begins by providing a semiconductor structure comprising a substrate having isolation structures thereon, which separate and electrically isolate: a first area having a P-well formed in the substrate and a gate over the substrate; a second area having a N-well formed in the substrate and a gate over the substrate; and a third area having P-well and buried N+ regions formed in the substrate with second isolation structures overlying the buried N+ regions. A photoresist mask is formed exposing the first area, and impurity ions are implanted to form n-type lightly doped source and drain regions. The photoresist mask is removed and a new (PLDD/ROM) photoresist mask is formed exposing the second area and the third area. Impurity ions are implanted to simultaneously form P-type lightly doped source and drain regions and a ROM cell surface implant region. The PLDD/ROM photoresist mask is then removed.

The present invention provides considerable improvement over the prior art. The key advantages of the present invention are that a separate ROM cell photolithography and implant step can be eliminated, thereby reducing processing time and cost, while yield and performance can be maintained.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a ROM cell surface implant region using a PLDD implant.

Figure 1:
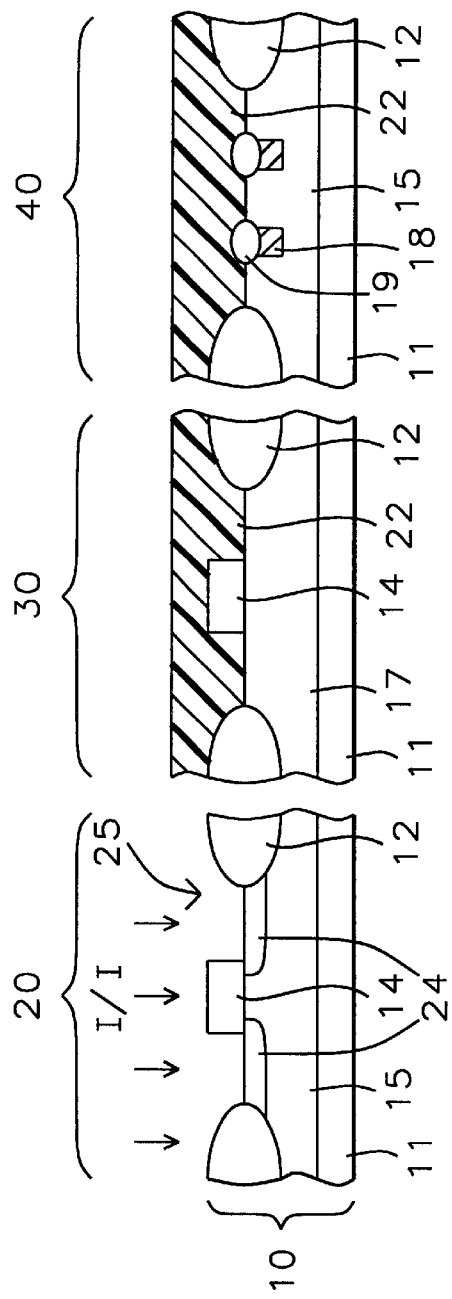
FIGS. 1, 2 & 3 illustrate sequential sectional views of a process for forming a NLDD, a PLDD, and ROM cell surface implant region according to the inventors' current process.
Figure 2:
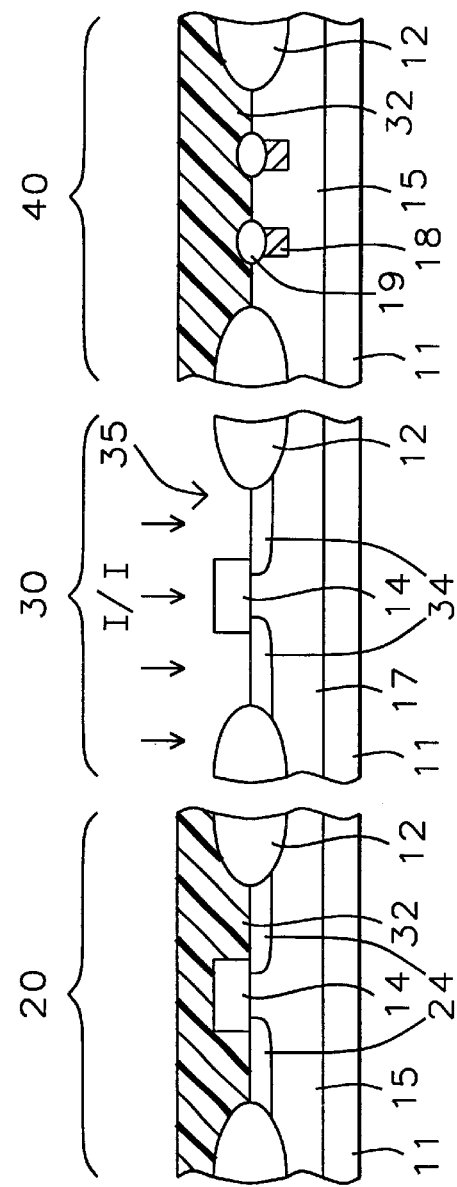
Figure 3:
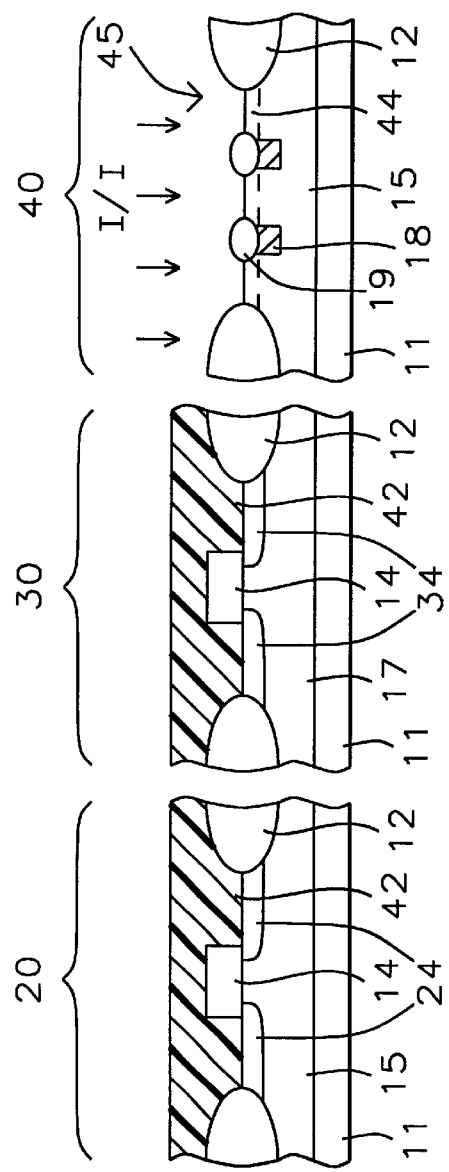

Problem Identified by the Inventors—FIGS. 1, 2 & 3

Referring to FIG. 1, a process known by the inventors begins by providing a semiconductor structure (10) comprising a substrate (11) having isolation structures (e.g.

regions) (12) thereon, separating and electrically isolating a first area (20), a second area (30) and a third area (40). The substrate (11) is preferably a P-doped monocrystalline silicon wafer as is known in the art. The isolation structures are preferably field oxide regions (FOX) or shallow trench isolation regions (STI) as are known in the art. In the first area (20), the semiconductor structure (10) further comprises a P-well (15) formed in the substrate (11) between adjacent isolation structures (12) and a gate structure (14) formed over the substrate (11). The gate structure (14) can include a gate dielectric and one or more overlying conductive layers such as polysilicon, silicides and other metals. In the second area (30), the semiconductor structure (10) further comprises a N-well (17) formed in the substrate (11) between adjacent isolation structures (12) and a gate structure (14) formed over the substrate (11). In the third area (40), the semiconductor structure (10) further comprises a P-well (15) formed in the substrate (11) between adjacent isolation structures (12) and buried N+ regions (18) formed in the substrate (11) with second isolation structures (19) overlying the buried N+ regions (43).

A NLDD photoresist mask (22) is formed over the semiconductor structure (10) having an NLDD opening (25) over the first area (20). N-type lightly doped source and drain regions (NLDD's) (24) are formed in the first area (20) by implanting N-type impurity ions into the substrate (11) adjacent to the gate structure (14) through the NLDD opening (25). The NLDD photoresist mask (22) is then removed.

Referring to FIG. 2, a PLDD photoresist mask (32) is formed over the semiconductor structure (10) having a PLDD opening (35) over the second area (30). P-type lightly doped source and drain regions (PLDD's) (34) are formed in the second area (30) by implanting P-type impurity ions into the substrate (11) adjacent to the gate structure (14) through the PLDD opening (35). The PLDD's (34) are preferably formed by implanting $BF_2$ ions into the substrate (11) at a dose of about $1.15E13$ atm/cm$^2$ and at an energy of about 50 KeV. The PLDD photoresist mask (32) is then removed.

Referring to FIG. 3, a ROM photoresist mask (42) is formed over the semiconductor structure (10) having a ROM opening (45) over the third area (40). ROM cell surface inplant regions (44) are formed in the third area (40) by implanting P-type impurity ions into the substrate (I 1) adjacent to the buried N+ regions (18) and overlying second isolation structures (19) through the ROM opening (45). The purpose of the ROM cell surface implant regions (44) is to prevent dopant ions from the buried N+ regions (18) from leaking or escaping at the surface of the substrate (11). The ROM cell surface implant regions (44) are preferably formed by implanting B ions into the substrate at a dose of about $1.00E13$ atm/cm$^2$ and at an energy of about 25 KeV. The ROM photoresist mask (42) is then removed.

The inventors have discovered that ROM cell surface implant can be performed using the PLDD implant step reducing process steps while maintaining yield and performace levels, thereby reducing cycle time and cost.

Figure 4:
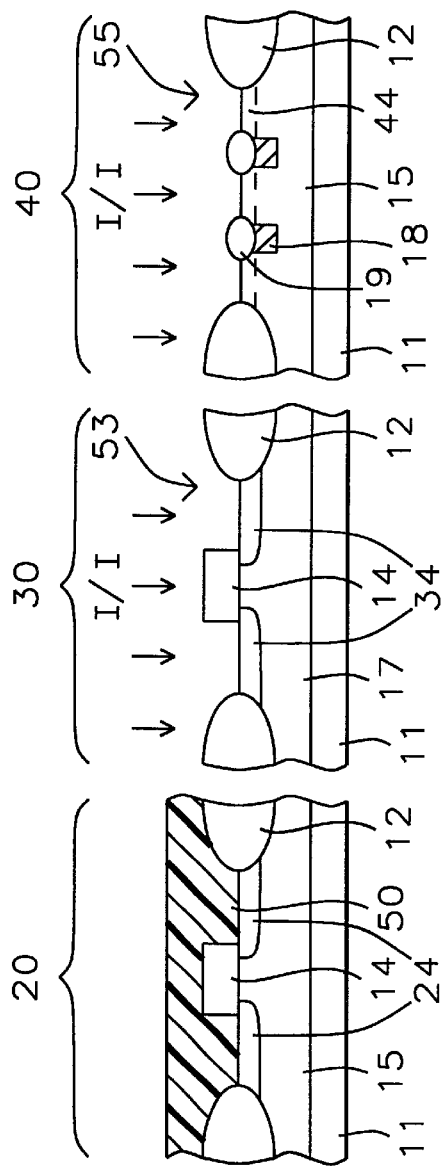
FIG. 4 illustrates a sectional view of a process for combining the PLDD implant and surface implant for forming a ROM cell surface implant region according to the present invention.

Preferred Embodiment of the Present Invention— FIGS. 1 & 4

The preferred embodiment of the present invention begins by providing a semiconductor structure (10) which is the same as is illustrated in FIG. 1 and described above. The NLDD implant is also performed as shown in FIG. 1 and described above. In the preferred embodiment, the P-well (15) in the first area (20) and the P-well (15) in the third area (40) are formed using an ion species of B at a concentration of between about $5E12$ atm/cm$^3$ and $1E13$ atm/cm$^3$ and haver a depth of between about 20,000 Angstroms and 30,000 Angstroms. Also, in the preferred embodiment the buried N+ regions (18) are formed using As ions at a concentration of between about $1.5E15$ atm/cm$^1$ and $3E15$ atm/cm$^3$ having a depth of between about 1000 Angstroms and 3000 Angstroms. The As ions are implanted at an energy of between about 40 KeV and 80 KeV and at a dose of between about $1.5E15$ atm/cm$^2$ and $3E15$ atm/cm$^2$. The buried N+ regions (18) are used as bit lines in the ROM device fabricated according to the present invention.

Referring to FIG. 4, a PLDD/ROM photoresist mask (50) is formed over the substrate (I 1) having a PLDD opening (53) over the second area (30) and a ROM opening (55) over the third area (40). A PLDD (34) and a ROM cell surface implant region (44) are simultaneously formed by implanting impurity ions through the PLDD opening (53) and the ROM opening (55) respectively. The PLDD (34) and the ROM cell surface implant region (44) are preferably formed by implanting $BF_2$ ions into the substrate (11) at a dose of between about $1E13$ atm/cm$^2$ and $2E13$ atm/cm$^2$ with a target of about $1.15E13$ atm/cm$^2$ and at an energy of between about 25 KeV and 75 KeV with a target of about 50 KeV. The PLDD/ROM photoresist mask (50) is then removed.

Alternatively, the simultaneous PLDD (34) and ROM cell surface implant can be performed using B ions at an energy of between about 25 KeV and 50 KeV and a dose of between about $1E13$ atm/cm$^2$ and $2E13$ atm/cm$^2$.

Figure 5A:
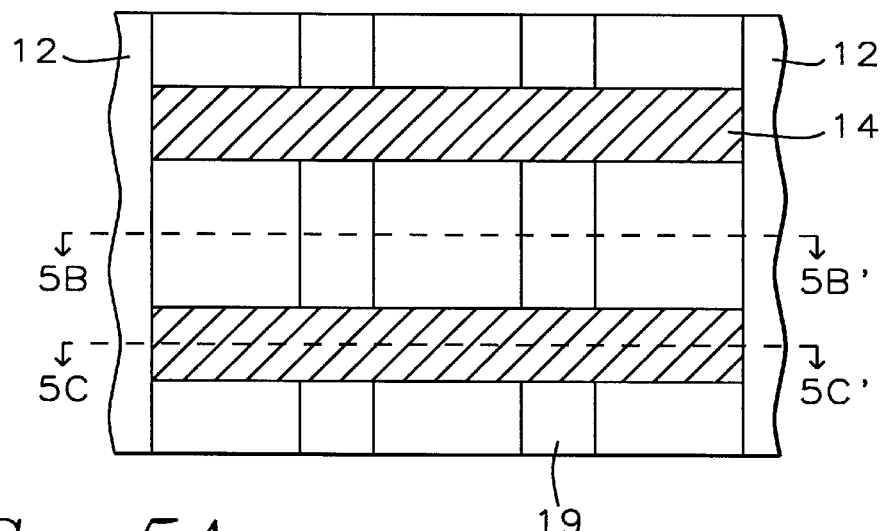
FIG. 5A shows a top view of a a ROM device formed according to the present invention.
Figure 5B:
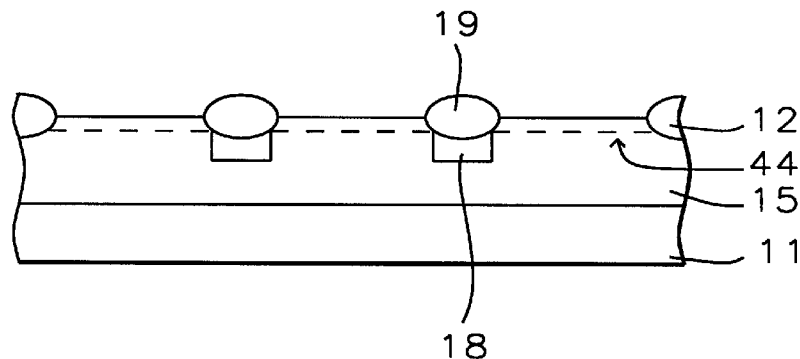
FIGS. 5B and 5C show sectional views of a ROM device formed according to the present invention taken generally along axis 5B—5B' and 5C—5C' respectively, as shown in FIG. 5A.
Figure 5C:
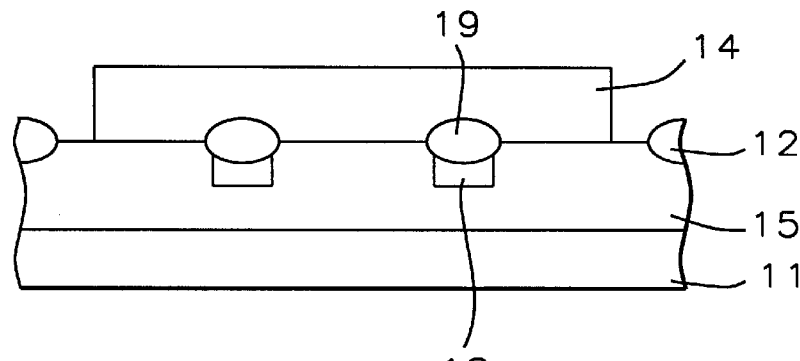

Referring to FIGS. 5A, 5B, and 5C, a polysilicon layer can be formed over the semiconductor structure (11) in the third area (40) and patterned to form gate structures (14) prior to the PLDD/ROM surface implant. As shown in FIG. 5A, the gate structures (14) are perpendicular to the N+ buried regions (bit lines) (18). The resulting ROM device has a ROM cell surface implant region (44) only in areas not covered by the gate structures (14) as shown in FIGS. 5B and 5C.

The key advantages of the present invention are that a separate ROM cell photolithography and implant step can be eliminated, thereby reducing processing time and cost, while yield and performance can be maintained.

Experimental Results

A split lot experiment was performed in which a first group of devices (standard) were formed using a PLDD implant and a separate ROM cell surface (isolation) implant comprising B ions implanted at an energy of about 25 KeV and a dose of about $1.00E13$ atm/cm$^2$. In a second group of devices (invention), the ROM cell surface implant was formed using the PLDD implant comprising $BF_2$ ions implanted at an energy of about 50 KeV and a dose of $1.15E13$ atm/cm$^2$. The performance and yield data demonstrate that the process of using the PLDD implant to form a ROM cell surface implant region can eliminate a photolithography and implant step while maintaining the performance and yield at levels comparable to the a process using separate photolithography and implant steps. The yield for devices formed according to the present invention varied from 1.4% lower than a process using separate implants to 1.0% higher than a process using separate implants. These variations are much less than the lot to lot variation for devices fabricated using two implants.

While the invention has been particularly shown and described with reference to the preferred embodiments thereof, it will be understood by those skilled in the art that various changes in form and details may be made without departing from the spirit and scope of the invention. For example, the conductivity types (e.g. P-type, N-type) be reversed for the regions and implant steps to create opposite type device.

What is claimed is:

1. A method for method for forming a ROM cell surface implant region using a PLDD implant, comprising the steps of:
   a. providing a semiconductor structure comprising a substrate having isolation structures thereon; said isolation structures separating and electrically isolating a first area, a second area, and a third area of said semiconductor structure; said first area further comprising a P-well formed in the substrate and a gate structure formed over the substrate; said second area further comprising a N-well formed in the substrate and a gate structure formed over the substrate; said third area further comprising a P-well formed in the substrate and buried N+ regions formed in the substrate with second isolation structures overlying said buried N+ regions;
   b. forming a NLDD photoresist mask having an NLDD opening over said first area of said semiconductor structure;
   c. implanting impurity ions through said NLDD opening to form n-type lightly doped source and drain regions;
   d. removing said NLDD photoresist mask;
   e. forming a PLDD/ROM photoresist mask over said semiconductor structure; said PLDD/ROM photoresist mask having an PLDD opening over said second area of said semiconductor structure and a ROM opening over said third area of said semiconductor structure;
   f. simultaneously implanting impurity ions through said PLDD opening to form p-type lightly doped source and drain regions and through said ROM opening to form a ROM cell surface implant region; and
   g. removing said PLDD/ROM photoresist mask.

2. The method of claim 1 wherein said p-type lightly doped source and drain regions and said ROM cell surface implant region are formed by implanting $BF_2$ ions into the substrate at a dose of between about $1E13$ atm/cm$^2$ and $2E13$ atm/cm$^2$ and at an energy of between about 25 KeV and 75 KeV.

3. The method of claim 2 wherein said P-well in said first area and said P-well in said second area are formed using an ion species of B at a concentration of between about $5E12$ atm/cm$^3$ and $1E13$ atm/cm$^3$ and have a depth of between about 20,000 Angstroms and 30,000 Angstroms.

4. The method of claim 1 wherein said p-type lightly doped source and drain regions and said ROM cell surface implant region are formed by implanting B ions into the substrate at a dose of between about $1E13$ atm/cm$^2$ and $2E13$ atm/cm$^2$ and at an energy of between about 25 KeV and 75 KeV.

5. A method for method for forming a ROM cell surface implant region using a PLDD implant, comprising the steps of:
   a. providing a semiconductor structure comprising a substrate having isolation structures thereon; said isolation structures separating and electrically isolating a first area, a second area, and a third area of said semiconductor stricture; said first area further comprising a P-well formed in the substrate using an ion species of B at a concentration of between about $5E12$ atm/cm$^3$ and $1E13$ atm/cm$^3$ and a gate structure formed over the substrate; said second area further comprising a N-well formed in the substrate and a gate structure formed over the substrate; said third area further comprising a P-well formed in the substrate using an ion species of B at a concentration of between about $5E12$ atm/cm$^3$ and $1E13$ atm/cm$^3$ and buried N+ regions formed in the substrate using an ion species of As at a concentration of between about $1.5E15$ atm/cm$^3$ and $3E15$ atm/cm$^3$ with second isolation structures overlying said buried N+ regions;
   b. forming a NLDD photoresist mask having an NLDD opening over said first area of said semiconductor structure;
   c. implanting impurity ions through said NLDD opening to form n-type lightly doped source and drain regions;
   d. removing said NLDD photoresist mask;
   e. forming a PLDD/ROM photoresist mask over said semiconductor structure; said PLDD/ROM photoresist mask having an PLDD opening over said second area of said semiconductor structure and a ROM opening over said third area of said semiconductor structure;
   f. simultaneously implanting impurity ions through said PLDD opening to form p-type lightly doped source and drain regions and through said ROM opening to form a ROM cell surface implant region by implanting $BF_2$ ions into the substrate at a dose of between about $1E13$ atm/cm$^2$ and $2E13$ atm/cm$^2$ and at an energy of between about 25 KeV and 75 KeV; and
   g. removing said PLDD/ROM photoresist mask.

6. The method of claim 5 which further includes, prior to simultaneosly implanting $BF_2$ ions through said PLDD opening and through said ROM opening, forming a polysilicon layer over said substrate structure in said third area, and patterning said polysilicon layer to form gate structures perpendicular to said N+ regions, whereby said $BF_2$ ions are not implanted in said semiconductor substrate in areas underlying said gate structures.

7. A method for method for forming a ROM cell surface implant region using a PLDD implant, comprising the steps of:
   a. providing a semiconductor structure comprising a substrate having isolation structures thereon; said isolation structures separating and electrically isolating a first area, a second area, and a third area of said semiconductor structure; said first area further comprising a P-well formed in the substrate using an ion species of B at a concentration of between about $5E12$ atm/cm$^3$ and $1E13$ atm/cm$^3$ and a gate structure formed over the substrate; said second area further comprising a N-well formed in the substrate and a gate structure formed over the substrate; said third area further comprising a P-well formed in the substrate using an ion species of B at a concentration of between about $5E12$ atm/cm$^3$ and $1E13$ atm/cm$^3$ and buried N+ regions formed in the substrate using an ion species of As at a concentration of between about $1.5E15$ atm/cm$^3$ and $3E15$ atm/cm$^3$ with second isolation structures overlying said buried N+ regions;
   b. forming a NLDD photoresist mask having an NLDD opening over said first area of said semiconductor structure;
   c. implanting impurity ions through said NLDD opening to form n-type lightly doped source and drain regions;
   d. removing said NLDD photoresist mask;
   e. forming a PLDD/ROM photoresist mask over said semiconductor structure; said PLDD/ROM photoresist mask having an PLDD opening over said second area of said semiconductor structure and a ROM opening over said third area of said semiconductor structure;
   f. simultaneously implanting impurity ions through said PLDD opening to form p-type lightly doped source and drain regions and through said ROM opening to form a ROM cell surface implant region by implanting B ions into the substrate at a dose of between about 1E13 atm/cm$^2$ and 2E13 atm/cm$^2$ and at an energy of between about 25 KeV and 75 KeV; and g. removing said PLDD/ROM photoresist mask.

8. The method of claim 7 which further includes, prior to simultaneosly implanting B ions through said PLDD opening and through said ROM opening, forming a polysilicon layer over said substrate structure in said third area, and patterning said polysilicon layer to form gate strictures perpendicular to said N+ regions, whereby said B ions are not implanted in said semiconductor substrate in areas underlying said gate structures.

* * * * *